United States Patent
Hoffman et al.

(10) Patent No.: US 7,026,713 B2
(45) Date of Patent: Apr. 11, 2006

(54) TRANSISTOR DEVICE HAVING A DELAFOSSITE MATERIAL

(75) Inventors: Randy Hoffman, Corvallis, OR (US); John Wager, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/738,690

(22) Filed: Dec. 17, 2003

(65) Prior Publication Data

US 2005/0133917 A1    Jun. 23, 2005

(51) Int. Cl.
*H01L 23/48*    (2006.01)

(52) U.S. Cl. .......................... 257/749; 257/66; 257/69; 257/72; 257/79; 257/103; 257/347; 438/82; 438/99

(58) Field of Classification Search ................ 257/749, 257/59, 66, 72, 69, 79, 103, 347; 438/82, 438/99
See application file for complete search history.

(56) References Cited

U.S. PATENT DOCUMENTS

| | | | |
|---|---|---|---|
| 5,744,864 A * | 4/1998 | Cillessen et al. .......... 257/749 |
| 6,455,875 B1 * | 9/2002 | Takemura et al. ............ 257/72 |
| 6,806,503 B1 * | 10/2004 | Hosono et al. ............... 257/79 |
| 6,821,811 B1 * | 11/2004 | Hirakata et al. .............. 438/82 |
| 2004/0155270 A1 | 8/2004 | Hoffman | |
| 2004/0155846 A1 | 8/2004 | Hoffman | |

FOREIGN PATENT DOCUMENTS

JP    2000 228516    8/2000

OTHER PUBLICATIONS

Anonymous, "Transparent and/or memory thin-film transistors in LCDs and PLGDs", 890 Research Disclosure 41148, 1998.
Aoki, A. and Sasakura, H., "Tin Oxide Thin Film Transistors", Japan J. Appl. Phys. 9 (1970) 582.
Giesbers et al., "Dry Etching of All-Oxide Transparent Thin Film Memory Transistors", Microelectronic Engineering 35 (1997) 71-74.
Grosse-Holz et al., "Semiconductive Behavior of Sb Doped $SnO_2$ Thin Films", Mat. Res. Soc. Symp. Proc., vol. 401, 1995, 67-72.
Hoffman et al., "ZnO-based transparent thin-film transistors", Applied Physics Letters, vol. 82, No. 5, 2003, 733-735.
Hossain et al., "Modeling and simulation of polycrystalline ZnO thin-film transistors", obtained from web, unknown publication date.
Klasens, H. and Koelmans, H., "A tin oxide field-effect transistor" Solid-State Electronics, vol. 7, 1964, 701-702.
Kobayashi et al., "Electrical and Optical Properties of Nano-Crystalline GaN and Nano-Crystalline GaN:H Thin Films", Mat. Res. Soc. Symp. Proc. vol. 467, 1997, 373-378.

(Continued)

*Primary Examiner*—Mai-Huong Tran

(57) ABSTRACT

A transistor device includes a channel of p-type substantially transparent delafossite material. Source and drain contacts are interfaced to the channel. Gate dielectric is between a gate contact and the channel.

36 Claims, 5 Drawing Sheets

OTHER PUBLICATIONS

Kobayashi et al., "Optical and electrical properties of amorphous and microcrystalline GaN films and their application to transparent TFT", Applied Surface Science 113/114 (1997) 480-484.

Kobayashi et al., "Optical and electrical properties of nano-crystalline GaN thin films and their application for thin-film transistor", Journal of Crystal Growth 189/190 (1998) 749-752.

Kobayashi et al., "Preparation of field effect transistor using nano-crystalline GaN", Journal of Non-Crystalline Solids 227-230 (1998) 1245-1249.

Masuda et al., "Transparent thin film transistors using ZnO as an active channel layer and their electrical properties", Journal of Applied Physics, vol. 93, No. 3 (2003) 1624-1630.

Ohya et al., "Thin Film Transistor of ZnO Fabricated by Chemical Solution Disposition", Jpn. J. Appl. Phys., vol. 40 (2001) 297-298.

Prins et al., "A ferroelectric transparent thin-film transistor", Appl. Phys. Lett. vol. 68, No. 25 (1996) 3650-3652.

Wollenstein et al., "An insulated gate thin-film transistor using SnO2 as semiconducting channel, a possible new gas sensor device", The 11th European Conference on Solid State Transducers, 1997, 471-474.

Otabe, Takuya, "n-type electrical conduction in transparent thin films of delafossite-type AgInO2", Applied Physics Letters, vol. 72, No. 9, Mar. 2, 1998, pp. 1036-1038.

Ibuki, Shuntaro, "Preparation on n-type conductive transparent thin films of AgInO2 . . . ", Journal of Applied Physics, vol. 88, No. 5, Sep. 1, 2000, pp. 3067-3069.

K. Nomura, "Thin-film transistor fabricated in single-crystalline . . . ", Science, vol. 300, May 23, 2003, pp. 1269-1272.

Ohta, H., "Frontier of transparent oxide semiconductors", Solid State Electronics, vol. 47, No. 12, Dec. 2003, pp. 2261-2267.

* cited by examiner

TRANSISTOR DEVICE HAVING A DELAFOSSITE MATERIAL

BACKGROUND

Description of the Prior Art

Thin film transistors are of great interest in the semiconductor industry as they represent a more universally applicable technology than traditional transistor devices. In some cases, thin film transistors also provide new properties that designers may leverage for great advantage. One interesting property is transparency.

DESCRIPTION OF THE PREFERRED EMBODIMENTS

Figure 1:
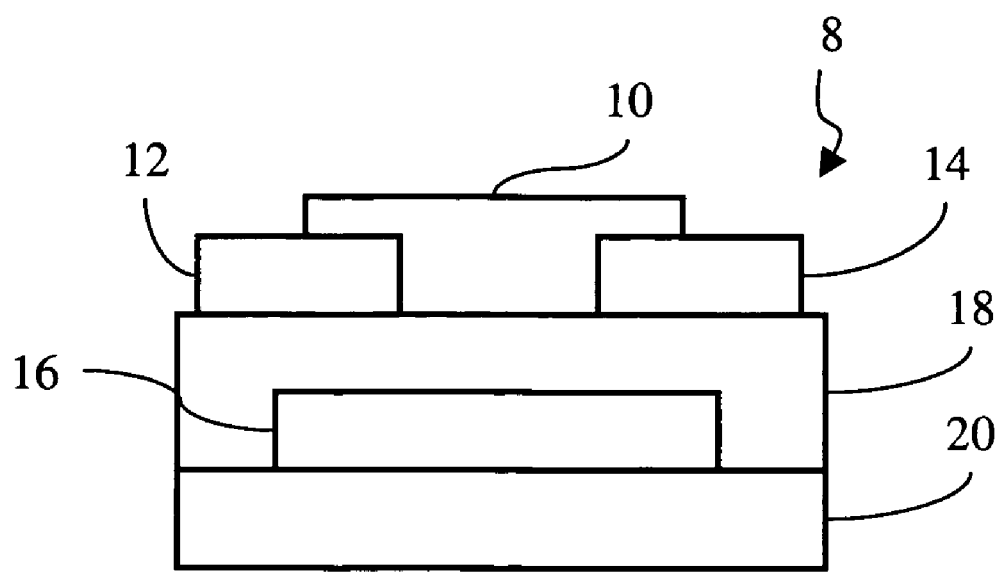
FIG. 1 is a schematic cross-section of an exemplary embodiment bottom gate p-type transparent channel thin film transistor.

The disclosed subject matter concerns transparent channel thin film transistors and a p-type transparent channel thin film transistor. In embodiments, an undoped or lightly doped delafossite material forms a p-type channel in a thin film transistor. In example embodiments, gate, source, drain regions and isolations are also formed from transparent materials to form a completely transparent device. Additional embodiments of the invention concern the integration of a p-type transparent delafossite channel transistor as the basis for a complementary metal oxide semiconductor (CMOS) circuit. A p-type transparent delafossite channel transistor may be integrated with conventional n-channel transparent thin film transistors for forming a CMOS circuit in accordance with embodiments of the invention. A CMOS transparent thin film circuit is thereby formed, and extends the general advantages of complementary circuits to a transparent channel thin film transistor circuit.

Thin film transistors of the embodiments of the invention have the general applicability of thin film transistors. Transparent device embodiments of the invention may be particularly well suited to display applications. Transparent devices are less likely to be affected by light than non-transparent devices, as the transparent devices absorb little to no energy from light.

Thin film transistors of example embodiments of the invention may be solution-processed at low temperatures. Choosing delafossite materials that are either soluble in a solution or capable of suspension in a solution permits processing by a solution technique, e.g., ink jet printing or spin coating. The solution-processed thin film transistors may be fabricated by simple techniques, e.g., direct printing of circuits. Screen printing is an example technique for patterning drain and source regions of solution-processed thin film transistors.

Embodiments of thin film transistor devices will now be illustrated. In the description, particular exemplary devices and device applications will be used for purposes of illustration, but the embodiments of the invention are not limited to the formation of the particular illustrated devices. Dimensions and illustrated devices may be exaggerated for purposes of illustration and understanding of the embodiments. Reference numerals may be used in different embodiments to indicate similar features. The elements of the drawings are not necessarily to scale relative to each other. Rather, emphasis has instead been placed upon clearly illustrating the embodiments of the invention. A device illustrated by a two-dimensional schematic layer structure will be understood by artisans to provide teaching of three-dimensional device structures and integrations.

Exemplary embodiments will now be discussed with respect to the figures. All device layers in the following description are thin film layers. FIG. 1 shows an exemplary embodiment bottom gate thin-film transistor 8. A p-type transparent channel 10 is controlled by co-planar source and drain contacts 12, 14 and a gate contact 16, which is isolated from the transparent channel 10 by gate dielectric 18. A substrate 20 upon which the transistor 8 is formed should have good dielectric properties and be compatible with the thin film materials used to form the transistor 8. Suitable exemplary substrates include glass and plastic. Particular examples include polycarbonate, polyarylate, polyethylenterephtalate (PET), polyestersulfone (PES), polyimide, polyolefin, and polyethylene naphtthalate (PEN).

Embodiments of the transistor 8 include partially transparent devices, e.g., where the p-type transparent channel 10 is the only transparent thin film, as well as completely transparent devices, i.e., where all of the thin films are formed from transparent materials. Additional embodiments include the use of a transparent substrate. The p-type transparent channel 10 is a delafossite film that is undoped or lightly doped. In lightly doped layers, the delafossite has a doping level low enough to maintain its transparency and semiconductor performance. As an example, lightly doped embodiments of the invention include doping levels that result in a carrier (hole) concentration of less than $\sim 10^{17}$ $cm^{-3}$. The apparent optical band gap of undoped delafossites is in the near-UV range, while heavily doped (and conductive) films may be nearly opaque. Delafossites are the materials having the crystal structure of $CuFeO_2$. Example delafossites include $CuScO_2$, $CuAlO_2$, $CuYO_2$, $CuFeO_2$, $CuCrO_2$, $CuGaO_2$, $CuInO_2$, $AgCoO_2$, $AgGaO_2$, $AgInO_2$, $AgScO_2$, and $AgCrO_2$. Any dopant suitable to provide hole carriers may be used. For example, $CuYO_2$ and $CuInO_2$ can be doped p-type using Ca. As another example $CuCrO_2$ can be doped p-type using Mg. Also, processing that results in a slight surplus of oxygen is often used to obtain p-type conductivity in these materials, and if controlled properly, may produce light doping levels for use as a p-type semiconductor channel in a transistor. Undoped and lightly doped p-type channels will yield an enhancement-mode or weakly depletion-mode transistor device. A negative gate voltage will draw holes from the source and drain contacts 12, 14 to the p-type channel 10 in a region near its interface with the gate dielectric 18. Undoped and lightly doped delafossite films additionally have the advantage of providing a reasonably small positive gate voltage to deplete holes from the channel, thereby producing a relatively low gate voltage turn-off condition.

Any number of materials may be employed for the gate dielectric 18, gate contact 16, source 12 and drain 14. The gate dielectric 18 for example may be a film of $SiO_2$, $Si_3N_4$, $Al_2O_3$, $Ta_2O_5$, $HfO_2$, $ZrO_2$, or the like. The gate contact 16 and source/drain layers may, for example, be formed from a transparent conductor (i.e., a p-type doped wide-band gap semiconductor) such as p-type doped GaN, $BaCu_2S_2$, NiO, $Cu_2O$, or various delafossites ($CuScO_2$, $CuAlO_2$, $CuYO_2$, $CuFeO_2$, $CuCrO_2$, $CuGaO_2$, $CuInO_2$, $AgCoO_2$, $AgGaO_2$, $AgInO_2$, $AgScO_2$, $AgCrO_2$), or the like. Gate contact and source/drain layers may also comprise metals such as Au, Pt, Pd, Ni, Cu, W, Mo, Cr, Ag, In, Sn, Ga, Zn, Al, Ti, or the like.

It is beneficial to choose a source and drain contact material to produce efficient hole injection from the source into the p-type delafossite channel 10 at the source/channel interface. Materials may be selected for a desired level of electrical performance. Overall device performance is likely to vary significantly for devices built using various source/drain contact materials. If the source, drain and gate contact films are formed of transparent materials, appropriate gate materials will likely also be transparent, thereby producing a complete device that is substantially transparent.

The delafossite channel 10 and transistor 8 have the capability to provide hole injection in the undoped or lightly doped channel, thereby creating a p-type device. Other transparent semiconductors typically have a high ionization potential (separation between valence band edge and vacuum level), e.g. in the range of 6–8 eV. Hole injection into the transparent channel is achieved when the source and drain contacts are formed of a material (metal or doped semiconductor) having a work function that is nearly equal to or greater than the ionization potential of the channel material. However, even high work function metals, e.g., Au, Pd and Pt, have work functions smaller than 6 eV. The lower ionization potential of the undoped and lightly doped delafossite materials provides the ability meet the conditions for hole injection.

Figure 2:
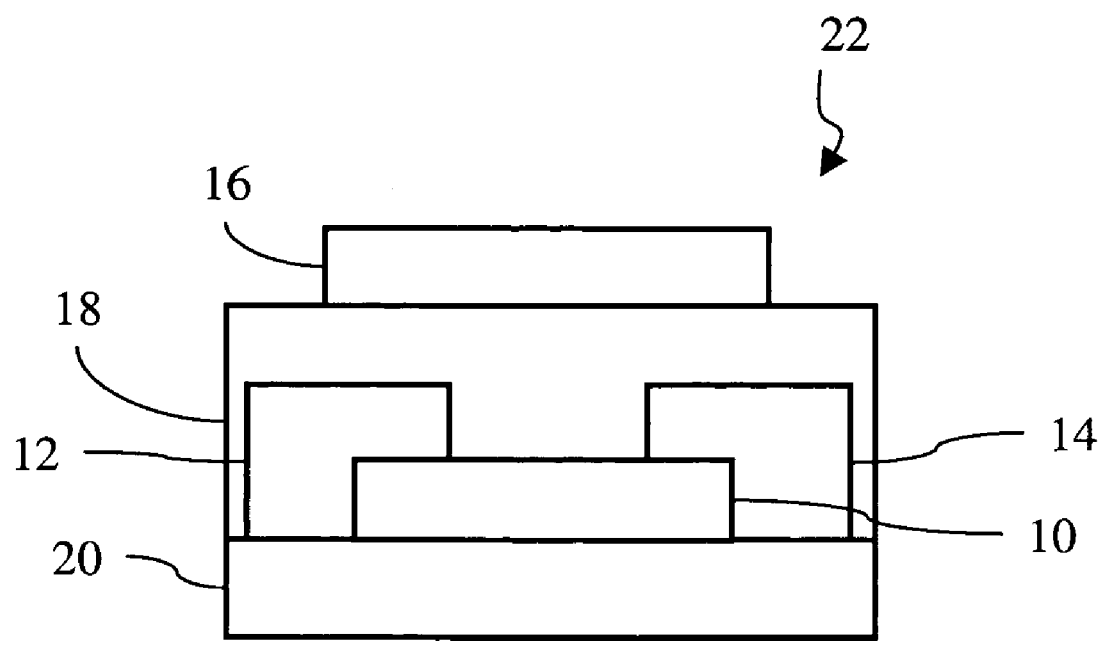
FIG. 2 is a schematic cross-section of an exemplary embodiment top gate p-type transparent channel thin film transistor.
Figure 3:
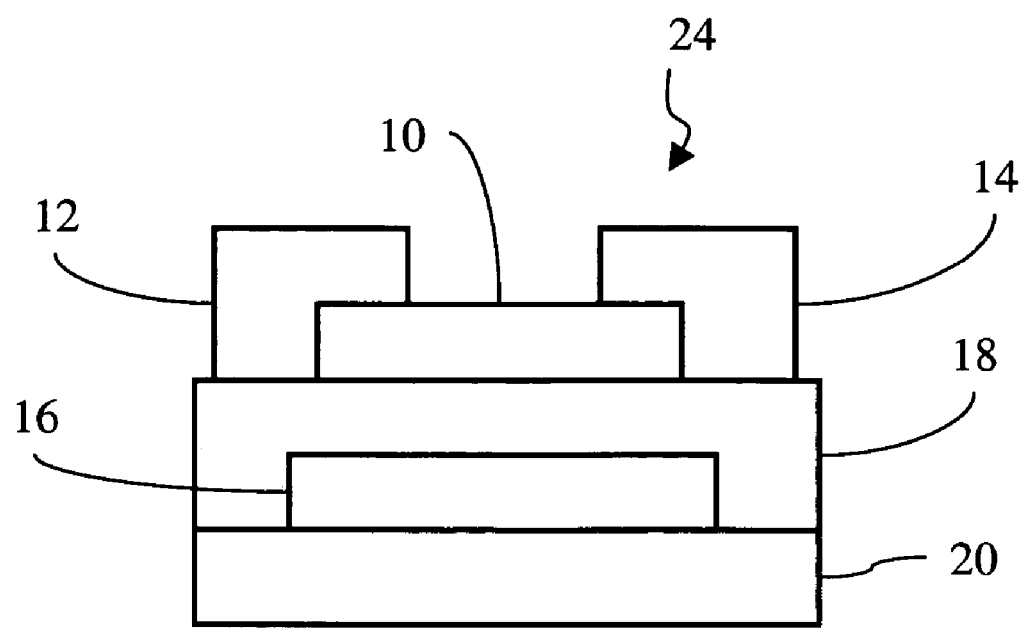
FIG. 3 is a schematic cross-section of an exemplary embodiment bottom gate p-type transparent channel thin film transistor.
Figure 4:
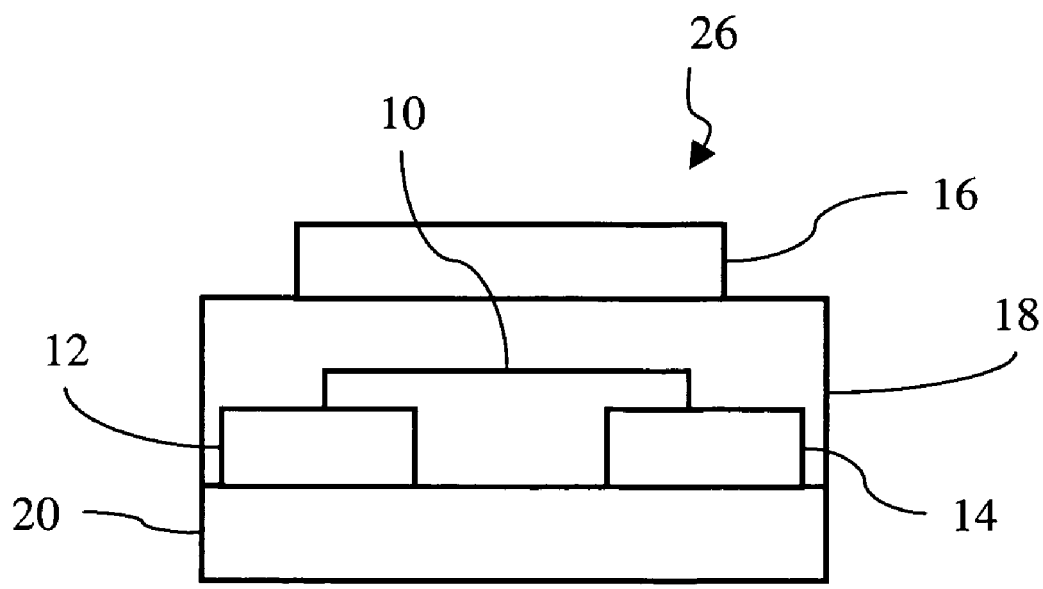
FIG. 4 is a schematic cross-section of an exemplary embodiment top gate p-type transparent channel thin film transistor.
Figure 5:
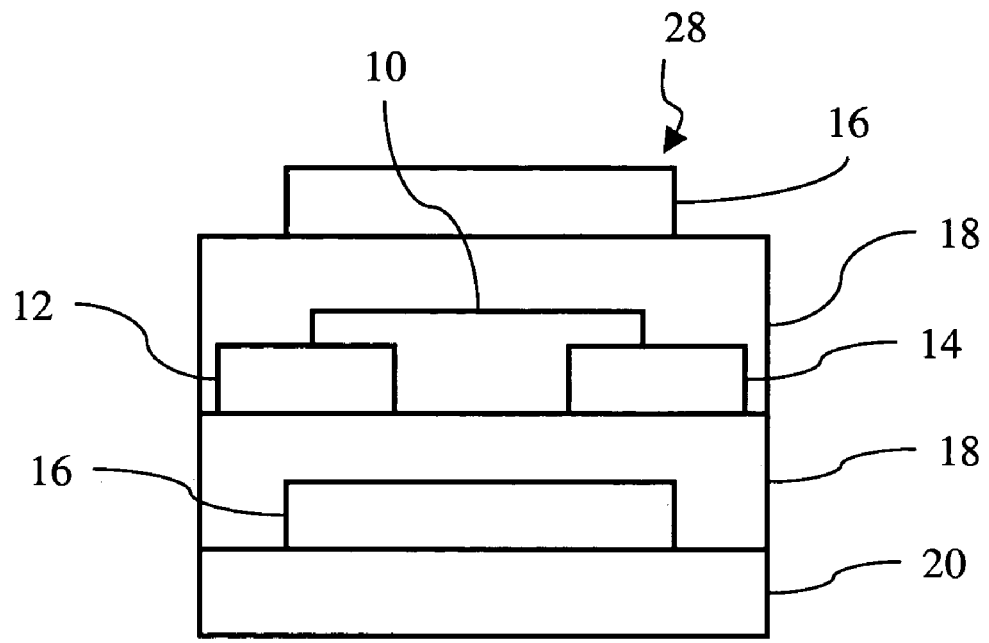
FIGS. 5 and 6 are schematic cross-sections of exemplary embodiment dual gate p-type transparent channel thin film transistors.
Figure 6:
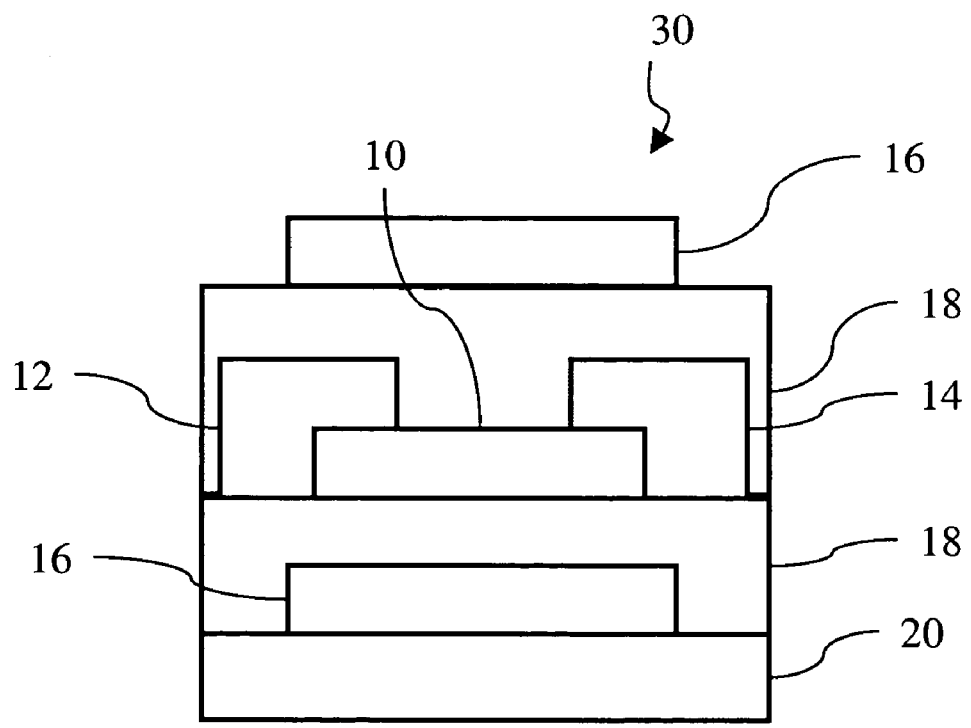

Other exemplary embodiment transistors of the invention are shown in FIGS. 2–6. The reference numerals from FIG. 1 are adopted to label similar elements in FIGS. 2–6. FIG. 2 shows an exemplary embodiment top gate p-type transparent channel thin film transistor 22 with co-planar source and drain contacts 12 and 14. FIG. 3 shows an exemplary embodiment bottom gate p-type transparent channel thin film transistor 24 with staggered contacts. FIG. 4 shows an exemplary embodiment top gate p-type transparent channel thin film transistor 26 with staggered contacts. FIG. 5 illustrates an exemplary embodiment dual gate p-type transparent channel thin film transistor 28. FIG. 6 illustrates another exemplary embodiment dual gate p-type transparent channel thin film transistor 30.

Figure 7:
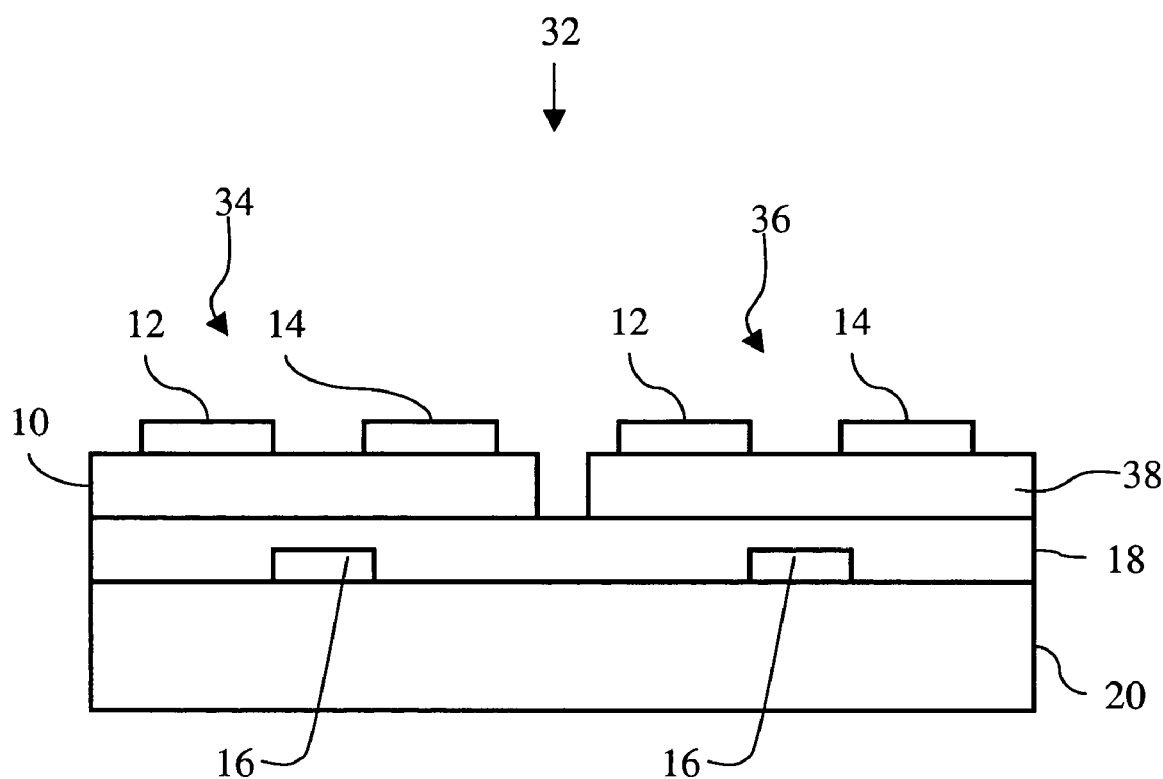
FIG. 7 is a schematic cross-section of a portion of an exemplary embodiment CMOS circuit including a p-type transparent thin film transistor.

FIG. 7 shows a portion of an exemplary embodiment CMOS circuit 32 including a p-type transparent thin film transistor 34 and an n-type transparent thin film transistor 36. The p-type transparent thin film transistor 34 includes an undoped or lightly doped transparent thin film channel 10. The n-type transparent thin film transistor 36 includes an n-type transparent thin film channel 38, for example ZnO. Alternative embodiments include CMOS integrations that include non-transparent thin film transistors, both n-type and p-type. Source 12, drain 14 and gate 16 contacts form part of a circuit interconnect pattern in the CMOS circuit 32. While two transistors are shown, the circuit 32 may include many transistors. The circuit may be arranged, for example, as an integrated circuit where transistors 34 and 36, and other transistors in the integrated circuit act as switches. In other embodiments, the circuit arrangement and applied voltages may provide amplification, for example. The circuit arrangement and applied voltages may also provide operation as a load device, for example to provide a resistance in a CMOS circuit. In operation, the undoped or lightly doped delafossite channel 10 uses a negative voltage to draw holes from the source 12 and drain 14 into the channel near the gate insulator. A range of negative voltages for a CMOS integrated circuit arranged in a CMOS switch configuration produces a conducting operation in the switch. As mentioned above, reasonable positive gate voltages will deplete the channel of free holes to turn off the transistor.

A variety of techniques are available for the formation of p-type transparent channel thin-film transistors, and circuits that include these transistors. Thin-film deposition techniques such as evaporation (thermal, e-beam), sputtering (DC, RF, ion beam), chemical vapor deposition (CVD), atomic layer deposition (ALD), molecular beam epitaxy (MBE), and the like may be employed. Alternate methods may also be employed, such as solution-based deposition from a liquid precursor (spin-coating, inkjet printing, etc). Film patterning may employ traditional photolithography combined with etching or lift-off processes, or may use alternate techniques such as shadow masking or direct-write patterning (i.e., inkjet printing).

With reference to the transistor 8 of FIG. 1, an initial deposition on the substrate 20 is an inkjet printing of a solution-based conductor to form the gate contact 16. The gate contact 16 may be part of a circuit interconnect pattern, for example patterned by a direct write process. In an alternate embodiment, a spin coating is used to deposit gate contact material, which is then patterned by a photolithography and etching procedure, or perhaps a more sophisticated process such as laser ablation. A spin coating process, for example, then deposits gate dielectric material 18. Additional direct write steps form the channel 10, and the gate and source contacts.

Figure 8:
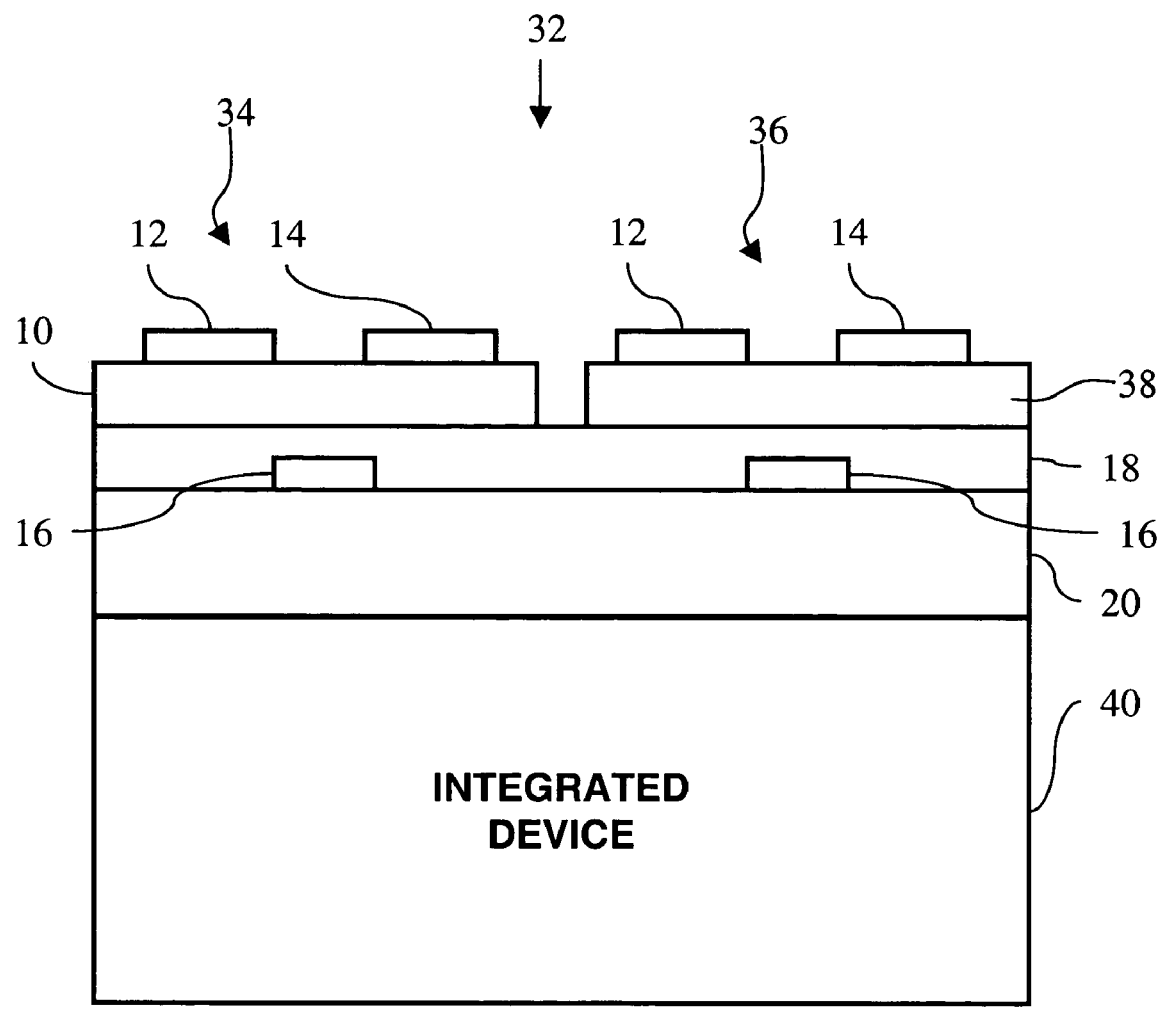
FIG. 8 is a schematic cross-section of an exemplary CMOS circuit with an embodiment of an integrated device.

FIG. 8 shows an exemplary embodiment including a CMOS circuit 32 in accordance with FIG. 7 combined with an integrated device 40. In a preferred embodiment, the entire CMOS thin film circuit 32 is formed to be transparent, i.e., p-type thin film transistors 34 and n-type thin film transistors 36 are formed as transparent devices. The substrate 20 is also transparent, e.g., a transparent plastic. The integrated device 40 may be, for example, an emissive display or include receptors for sensing or encoding or some other function. The integrated device 40 may be in the form of a thick film integration, e.g., silicon wafer based integration or a group III-V based integration, bonded or otherwise attached to the substrate 20. It might also be an additional thin film integration formed on the backside of the substrate 20. Because the CMOS circuit is transparent, one optical path that may be defined to the integrated device 40 is through the CMOS circuit 32. This provides designers with an added level of flexibility, as electronics embodied in the CMOS thin film circuit 32 may be placed irrespective of optical paths necessary for device operation. In other embodiments of a display or sensor, the CMOS thin film circuit 32 is outside of the optical paths in an integrated device. A fully transparent CMOS thin film circuit 32 or a CMOS circuit 32 with transparent channels is less likely to be affected by light in a display or sensor device.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

The invention claimed is:

1. A transistor device, comprising:
   a channel of p-type substantially transparent delafossite material;
   a source contact interfaced to said channel;
   a drain contact interfaced to said channel;
   a gate contact; and
   a gate dielectric between said gate contact and said channel.

2. The device of claim 1, wherein said p-type delafossite material comprises undoped delafossite material.

3. The device of claim 1, wherein said gate contact is formed upon a substrate, said gate dielectric is formed upon said gate contact, and said channel is formed upon said gate dielectric.

4. The device of claim 3, wherein said source contact and said drain contact comprise co-planar contacts.

5. The device of claim 3, wherein said source contact and said drain contact comprise staggered contacts.

6. The device of claim 3, wherein said gate, source and drain contacts are patterned to form a circuit interconnect pattern.

7. The device of claim 6, further comprising an n-type transparent channel transistor connected through the circuit pattern to form a CMOS circuit.

8. The device of claim 7, further comprising an integrated device, wherein the integrated device attaches or is formed upon a backside of the substrate.

9. The device of claim 3, further comprising an additional dielectric and an additional gate contact formed upon said channel and said source and drain contacts.

10. The device of claim 1, wherein the delafossite material is selected from the group consisting of $CuScO_2$, $CuAlO_2$, $CuYO_2$, $CuFeO_2$, $CuCrO_2$, $CuGaO_2$, $CuInO_2$, $AgCoO_2$, $AgGaO_2$, $AgInO_2$, $AgScO_2$, $AgCrO_2$, and mixtures thereof.

11. The device of claim 9, wherein:
    said gate dielectric is formed from a material selected from the group consisting of $SiO_2$, $Si_3N_4$, $Al_2O_3$, $Ta_2O_5$, $HfO_2$, $ZrO_2$, and mixture thereof; and
    said source, drain and gate contacts are formed from a material selected from the group consisting of doped semiconductors and metals.

12. The device of claim 10, wherein said source, drain and gate contacts comprise a doped semiconductor selected from the group consisting of GaN, $BaCu_2S_2$, NiO, $Cu_2O$, $CuScO_2$, $CuAlO_2$, $CuYO_2$, $CuFeO_2$, $CuCrO_2$, $CuGaO_2$, $CuInO_2$, $AgCoO_2$, $AgGaO_2$, $AgInO_2$, $AgScO_2$, $AgCrO_2$, and mixtures thereof.

13. The device of claim 1, wherein said source and drain contacts are formed upon a substrate, said channel is formed upon the substrate, and said gate dielectric is formed upon said source and drain contacts and said channel.

14. The device of claim 13, wherein said source contact and said drain contact comprise co-planar contacts.

15. The device of claim 14, wherein said source contact and said drain contact comprise staggered contacts.

16. The device of claim 13, wherein said gate, source and drain contacts are patterned to form a circuit interconnect pattern.

17. The device of claim 16, further comprising an n-type transparent channel transistor connected through the circuit pattern to form a CMOS circuit.

18. The device of claim 17, further comprising an integrated device, wherein the integrated device attaches or is formed upon a backside of the substrate.

19. The device of claim 13, wherein the delafossite material is selected from the group consisting of $CuScO_2$, $CuAlO_2$, $CuYO_2$, $CuFeO_2$, $CuCrO_2$, $CuGaO_2$, $CuInO_2$, $AgCoO_2$, $AgGaO_2$, $AgInO_2$, $AgScO_2$, $AgCrO_2$, and mixtures thereof.

20. The device of claim 19, wherein:
    said gate dielectric is formed from a material selected from the group consisting of $SiO_2$, $Si_3N_4$, $Al^2O_3$, $Ta_2O_5$, $HfO_2$, $ZrO_2$, and mixtures thereof; and
    said source, drain and gate contacts are formed from a material selected from the group consisting of doped semiconductors and metals.

21. The device of claim 20, wherein said source, drain and gate contacts comprise a doped semiconductor selected from the group consisting of GaN, $BaCu_2S_2$, NiO, $Cu_2O$, $CuScO_2$, $CuAlO_2$, $CuYO_2$, $CuFeO_2$, $CuCrO_2$, $CuGaO_2$, $CuInO_2$, $AgCoO_2$, $AgGaO_2$, $AgInO_2$, $AgScO_2$, $AgCrO_2$, and mixtures thereof.

22. The device of claim 19, wherein each of said source, drain and gate contacts, and said gate dielectric is formed from a transparent material such that the device comprises a transparent device.

23. The device of claim 1, wherein said p-type substantially transparent delafossite material comprises undoped or lightly doped delafossite material.

24. The device of claim 1, formed as a thin film device.

25. A thin film transistor device, comprising:
    a thin film channel of undoped or lightly doped p-type delafossite material, the delafossite material being substantially transparent; and
    means for controlling conduction in said thin film channel.

26. The device of claim 25, wherein said means for controlling comprise gate, source and drain thin film contacts.

27. The device of claim 26, wherein said gate source and drain thin film contacts are patterned to form a circuit interconnect pattern.

28. The device of claim 27, further comprising an n-type transparent channel thin film transistor connected through the circuit pattern to form a CMOS circuit.

29. The device of claim 28, further comprising an integrated device, wherein the integrated device attaches or is formed upon a backside of a substrate upon which the CMOS circuit is formed.

30. A thin film transistor device, comprising:
    a thin film channel of substantially transparent p-type material;
    a thin film source contact interfaced to said channel;
    a thin film drain contact interfaced to said channel;
    a thin film gate contact; and
    a thin film gate dielectric between said thin film gate contact and said channel; wherein materials for said thin film channel, said thin film source contact, and said thin film drain contact are selected so that a work function of materials of the thin film source and drain contacts is nearly equal to or greater than an ionization potential of the p-type material of the thin film channel.

31. The device of claim 30, wherein the transparent p-type material comprises a delafossite material.

32. The device of claim 31, wherein the delafossite thin film comprises an undoped delafossite material.

33. The device of claim 31, wherein the delafossite material is selected from the group consisting of $CuScO_2$, $CuAlO_2$, $CuYO_2$, $CuFeO_2$, $CuCrO_2$, $CuGaO_2$, $CuInO_2$, $AgCoO_2$, $AgGaO_2$, $AgInO_2$, $AgScO_2$, $AgCrO_2$, and mixtures thereof.

34. The device of claim 32, wherein:
said thin film gate dielectric is formed from a material selected from the group consisting of $SiO_2$, $Si_3N_4$, $Al_2O_3$, $Ta_2O_5$, $HfO_2$, $ZrO_2$, and mixtures thereof; and
said thin film source, drain and gate contacts are formed from a material selected from the group consisting of doped semiconductors and metals.

35. The device of claim 34, wherein said thin film source, drain and gate contacts comprise a doped semiconductor selected from the group consisting of GaN, $BaCu_2S_2$, NiO, $Cu_2O$, $CuScO_2$, $CuAlO_2$, $CuYO_2$, $CuFeO_2$, $CuCrO_2$, $CuGaO_2$, $CuInO_2$, $AgCoO_2$, $AgGaO_2$, $AgInO_2$, $AgScO_2$, $AgCrO_2$, and mixtures thereof.

36. The device of claim 30, wherein each of said thin film source, drain and gate contacts, and said thin film gate dielectric is formed from a transparent material such that the device comprises a transparent device.

* * * * *